United States Patent
Chen

(10) Patent No.: US 8,330,549 B1
(45) Date of Patent: Dec. 11, 2012

(54) OSCILLATOR CIRCUIT WITH VOLTAGE BOOSTER

(75) Inventor: Yong Chen, Hangzhou (CN)

(73) Assignee: Global Ionics LLC, Pleasantville, NY (US)

( * ) Notice: Subject to any disclaimer, the term of this patent is extended or adjusted under 35 U.S.C. 154(b) by 0 days.

(21) Appl. No.: 13/456,272

(22) Filed: Apr. 26, 2012

(51) Int. Cl.
  *H03B 5/12* (2006.01)
(52) U.S. Cl. .................. 331/117 R; 331/167
(58) Field of Classification Search ............ 331/167, 331/117 R, 117 FE
  See application file for complete search history.

(56) References Cited

U.S. PATENT DOCUMENTS

| 4,009,454 | A * | 2/1977 | Darrow ................ 331/117 R |
| 7,411,468 | B2 * | 8/2008 | Luong et al. ............ 331/167 |
| 7,414,488 | B2 * | 8/2008 | Lee et al. .............. 331/167 |
| 7,532,080 | B2 * | 5/2009 | Rhode et al. .......... 331/117 R |
| 7,724,102 | B2 | 5/2010 | Ullmann |
| 8,018,292 | B2 * | 9/2011 | Wachi et al. .......... 331/117 R |
| 8,035,457 | B2 * | 10/2011 | Chang et al. ............ 331/167 |
| 8,134,847 | B2 | 3/2012 | Trattler |
| 8,169,269 | B2 * | 5/2012 | Bao .................. 331/117 FE |
| 2003/0227336 | A1 * | 12/2003 | Wang et al. ............ 331/100 |

* cited by examiner

*Primary Examiner* — Joseph Chang
(74) *Attorney, Agent, or Firm* — Frommer Lawrence & Haug LLP; Porter F. Fleming; Paul A. Levy

(57) ABSTRACT

An oscillator circuit with a voltage booster includes separated coils to oscillate and boost the input direct current voltage. The two coils are wound in opposite directs and magnetically coupled to one another. One of the coils is in series with a capacitor to form a LC oscillator. The circuit enables changing the frequency of oscillation by changing the number of turns on the coil in series with the capacitor or by changing the value of the capacitor. The output voltage level can be changed by changing the number of turns on the remaining coil.

16 Claims, 7 Drawing Sheets

OSCILLATOR CIRCUIT WITH VOLTAGE BOOSTER

BACKGROUND

1. Field of the Invention

This application concerns an oscillator circuit. In particular, when a direct current (DC) voltage is applied, the circuit can provide an output voltage that is greater than the applied DC voltage.

2. Description of Related Art

Oscillators convert a DC supply voltage, such as a battery, into an alternating current (AC) output. There are various types of oscillator circuits. Depending on the field of application, an oscillator may be required to have certain operational parameters, such as low power consumption, low phase noise, high oscillation frequency, wide oscillation frequency adjustment range, low sensitivity to interference signals and/or low manufacturing cost.

By way of example, some LC oscillators, which include frequency determining components such as inductors (L) and capacitors (C), achieve a number of the above-listed parameters. The values of the inductors and capacitors determine the frequency (oscillation frequency) of the resultant AC output.

FIG. 1 illustrates a basic LC Oscillator Tank Circuit. The circuit consists of an inductive coil, L' (L prime) and a capacitor, C' (C prime). The capacitor stores energy in the form of an electrostatic field (voltage) across its plates, a and b, while the inductive coil L' stores energy in the form of an electromagnetic field. When switch S1 is in position 1, the capacitor C' charges up to the DC supply voltage of battery B. The switch is then moved to position 2, which puts the capacitor C' in parallel with inductor L'. Capacitor C' will discharge through inductor L', resulting in the voltage across C falling as the current through L begins to rise in a first direction. The increase in current in L' causes electromagnetic field around L', which resists this flow of current. When capacitor C' is completely discharged the energy that was originally stored in capacitor C' as is now stored in the inductive coil L' as an electromagnetic field around the coil windings.

Because there is no external voltage in the circuit to maintain the current within the coil, the electromagnetic field begins to collapse. The collapse of the magnetic field causes a back electromotive force (back EMF) to be induced in inductor L', which attempts to keep the current flowing in the original direction. This current now charges up capacitor C' with the opposite polarity to its original charge. C' continues to charge up until the current reduces to zero and the electromagnetic field of the coil has collapsed completely. The energy originally introduced into the circuit through the switch, has been returned to the capacitor which again has a voltage potential across it, although it is now of the opposite polarity. The capacitor now starts to discharge again back through the coil L' and the whole process is repeated. The polarity of the voltage changes as the energy is passed back and forth between the capacitor and inductor. This process would repeat indefinitely but for energy losses in the transfer between L' and C'. Accordingly, circuitry has been developed to replace the lost energy.

FIG. 2 illustrates a Transistor LC Oscillator is one circuitry that uses a transistor as an amplifier switch to take a part of the output from the LC Tank circuit, amplify it and feed the energy back into the LC tank circuit.

A transistor Q' (Q prime) is used as the LC oscillator amplifier. LC tank circuit 200 is the collector load of Q'. The amplifier 202 includes transistor Q and another coil L" (L double prime) that has an electromagnetic field mutually coupled to the field of L' and is connected between the base and the emitter of transistor Q. Accordingly, mutual inductance exists between tank circuit 200 and amplifier circuit 202. The changing current flowing in one coil circuit induces, by electromagnetic induction, a potential voltage in the other. As such, when the oscillations occur in LC tank circuit 200, electromagnetic energy is transferred from coil L' to coil L" and a voltage of the same frequency as that in tank circuit 200 is applied between the base and emitter of transistor Q. In this way the necessary automatic feedback voltage is applied to the amplifying transistor.

The amount of feedback is controlled by the coupling between the two coils L' and L". In order to maintain oscillations, the voltage applied to the tank circuit must be "in-phase" with the oscillations occurring in the tank circuit. This is achieved by winding the coil of L" in the correct direction relative to coil L' giving the correct amplitude and phase relationships for the oscillators circuit. The output voltage Vout is sinusoidal and such oscillators are often referred to as "harmonic oscillators."

Harmonic oscillators come in many different forms because there are many different ways to construct an LC tank circuit and amplifier with the most common being the Hartley LC Oscillator, Colpitts LC Oscillator, Armstrong Oscillator and Clapp Oscillator to name a few.

In FIG. 3, Integrated circuit timer 555, R1' (R1 prime) and C1' (C1 prime) comprise an oscillating unit. The oscillating frequency varies with the value of R1' and C1'. With R1'=12 KΩ and C1'=2200 pF, the oscillating frequency will be about 20 kHz and the output dc voltage Vout will be about 2.2 times as much as the voltage of power supply Vin. The output current could reach as much as 50 mA. Bipolar transistors are used in this circuit. In this circuit the voltage of the power supply has to be equal to or greater than about 4.5V to operate the 555 timer.

Circuitry may be added to oscillator circuits to boost the output voltage as compared to the input voltage. FIG. 4 illustrates an LC oscillator having two stages of amplification realized by VT1 and VT2. Vin can be 1.5V and the amplification result in Vout=9V. In this case, VT3 and VD3 act as a series pass regulator to keep Vout from rising above the breakdown voltage of VD3 and base-emitter of VT3.

SUMMARY OF THE DISCLOSURE

Disclosed is an oscillator circuit with voltage booster that includes a first inductor and a second inductor magnetically coupled to the first inductor. A first terminal of the of the second inductor is connected to a first terminal of the first inductor at an input voltage junction point. A first transistor has a first transistor emitter connected to the input voltage junction point. A second transistor has a second transistor emitter connected to the input voltage common return point. A collector of the second transistor collector is coupled to a second terminal of the first inductor and the base of the second transistor is connected to the collector of the first transistor collector. A capacitor is in series with the second inductor. A first terminal of the capacitor is connected to a second terminal of the second inductor and the remaining terminal of the capacitor is connected to the base of the second transistor. When a direct current voltage is applied across the input voltage junction point and the input voltage common return point, and a predetermined voltage level is applied to the base of the first transistor to turn the first transistor ON then an oscillating voltage occurs at the collector of the second transistor.

DETAILED DESCRIPTION

In these discussions the terms "on", "saturated mode" and "saturation" as applied to a transistor are used interchangeably to mean a transistor in the ON state as is commonly understood by those of skill in the art. The terms "off", "cutoff mode" and "cutoff" as applied to a transistor are used to mean a transistor in the OFF state as is commonly understood by those of skill in the art. The term "inductor", "coil." and "inductive element" are used interchangeably.

Figure 1:
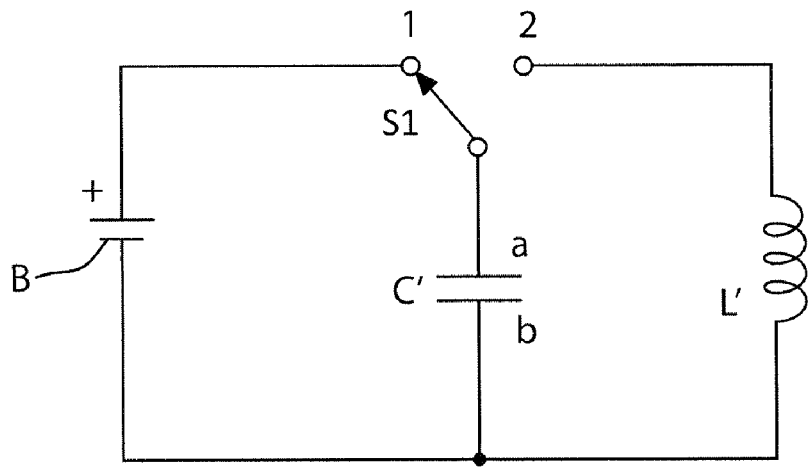
FIG. 1 illustrates a simple LC oscillator circuit.
Figure 2:
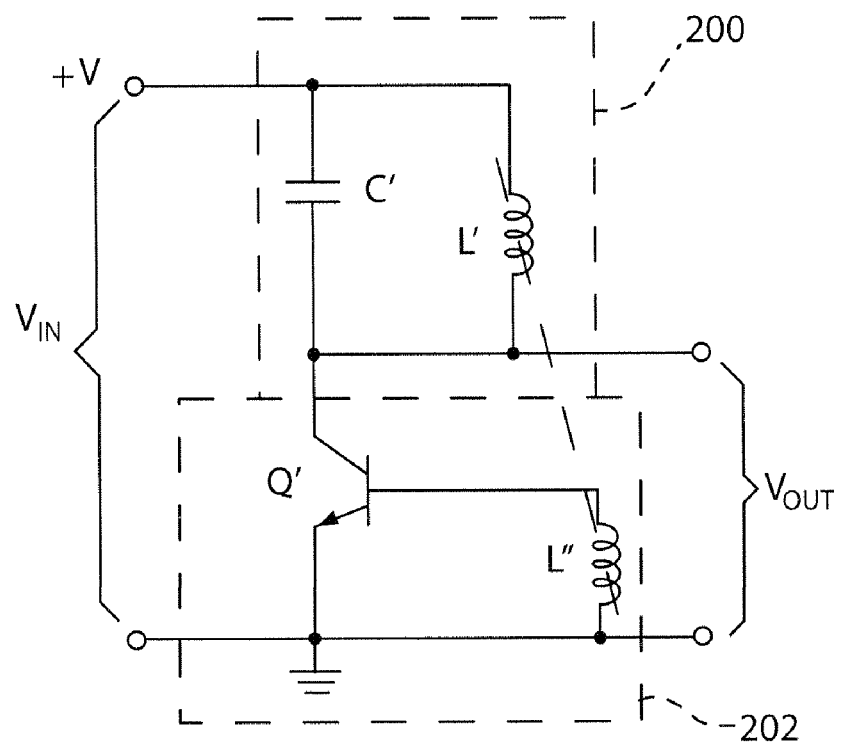
FIG. 2 illustrates an LC oscillator having a transistor amplifier.
Figure 3:
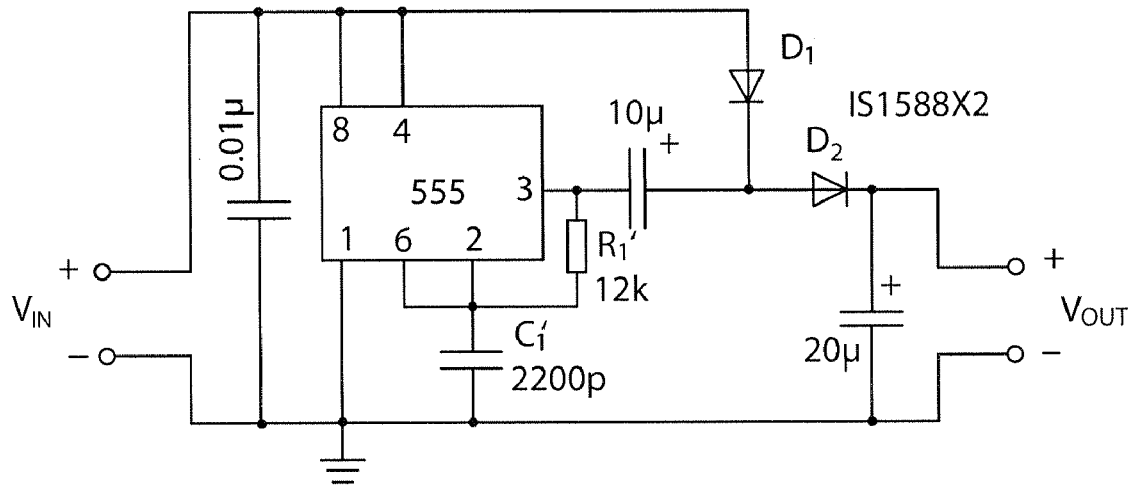
FIG. 3 illustrates an oscillator using a integrated circuit timer.
Figure 4:
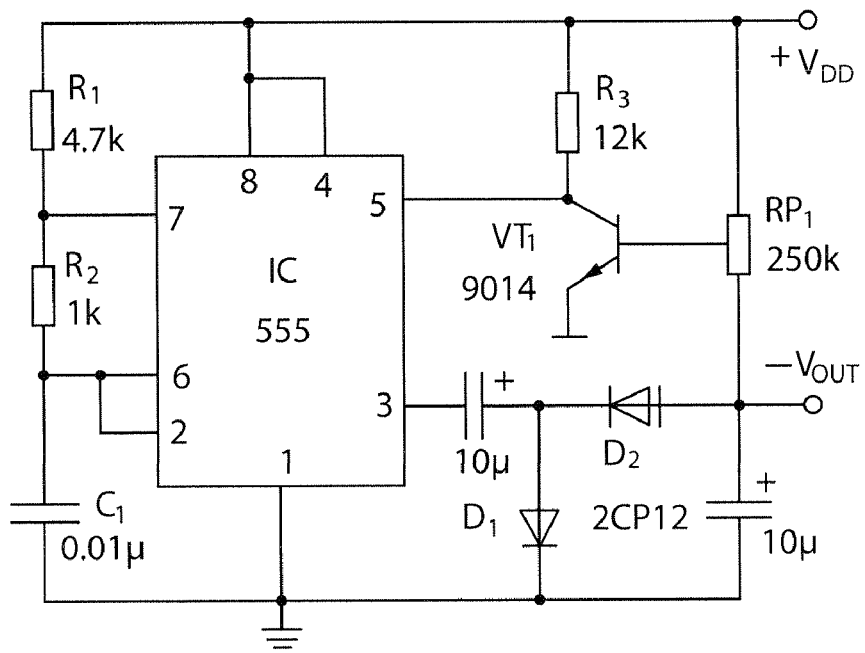
FIG. 4 illustrates an oscillator using an integrated circuit timer and having a transistor amplifier.
Figure 5:
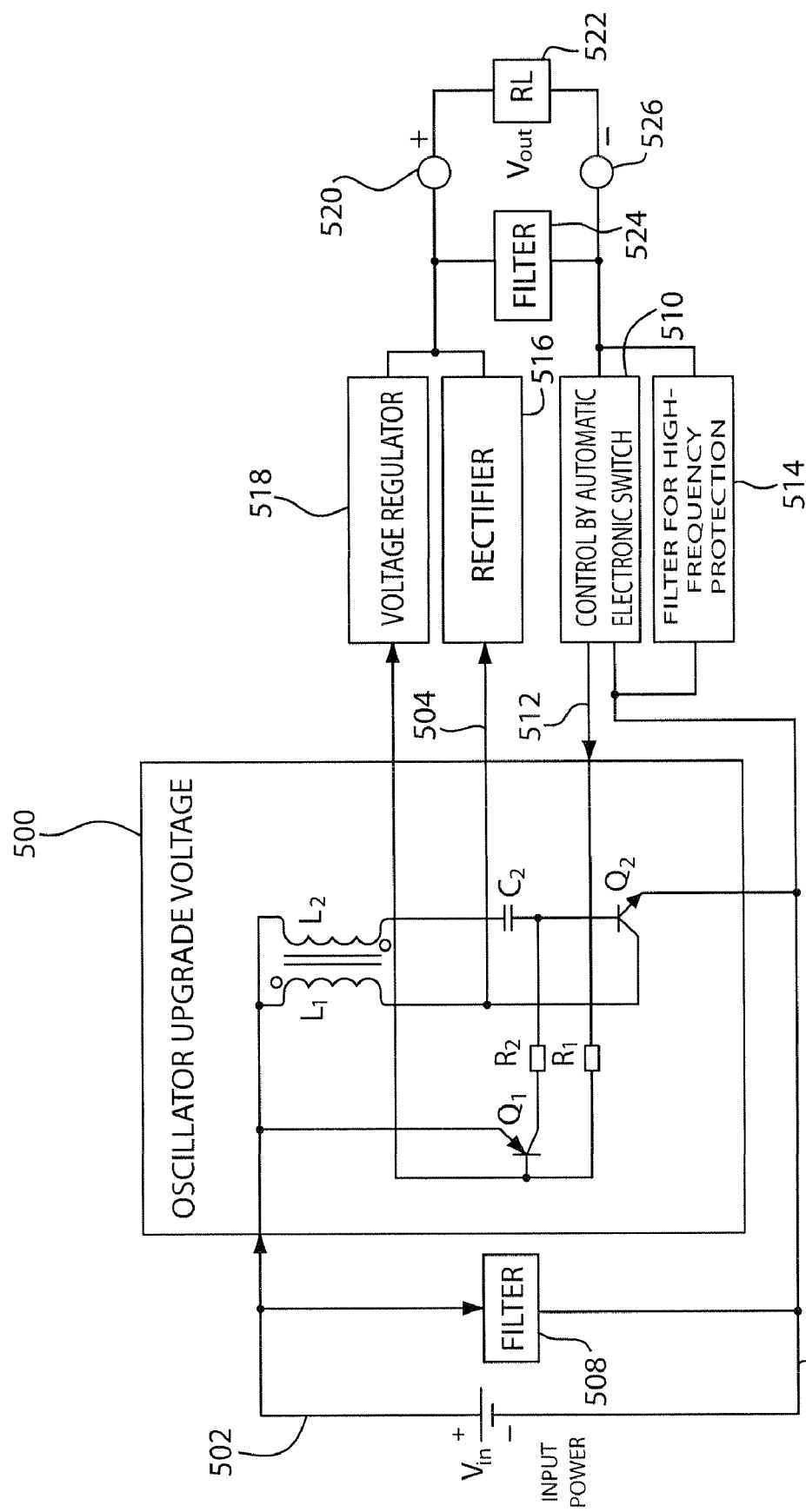
FIG. 5 is a block diagram of the oscillator circuit with voltage booster according to the present invention.

FIG. 5 illustrates an oscillator circuit with voltage booster 500 ("oscillator/booster") for converting a direct current (DC) input voltage Vin provided on a line 502 to an oscillating output voltage Vosc on a line 504. As described later, Vosc 504 will have a greater peak voltage level than Vin 502. Vin 502 has a return on common line 506 ("common"). An input filter 508 may be placed across the DC input voltage. In an embodiment, operation of the oscillator/booster 500 may be started using an electronic switch 510. As discussed herein below, electronic switch 510 may start the oscillator/booster 500 by providing a starting voltage Vstart on line 512 to the oscillator/booster. A high frequency filter 514 can be placed across the electronic switch 510 to filter high frequency electrical noise developed, for example, in the switching circuitry to avoid undesired starting of the oscillator/booster. Vosc 504 can be provided to a rectifier 516, which provides rectified Vosc as an output voltage Vout on a line or terminal 520 to a load RL 522. Vout 520 can also be provided to a voltage regulator 518 for controlling the peak voltage level of Vosc 504 from the oscillator/booster. Rectified Vosc, which is equivalent to Vout 520, may also be filtered by an output filter 524.

Figure 6:
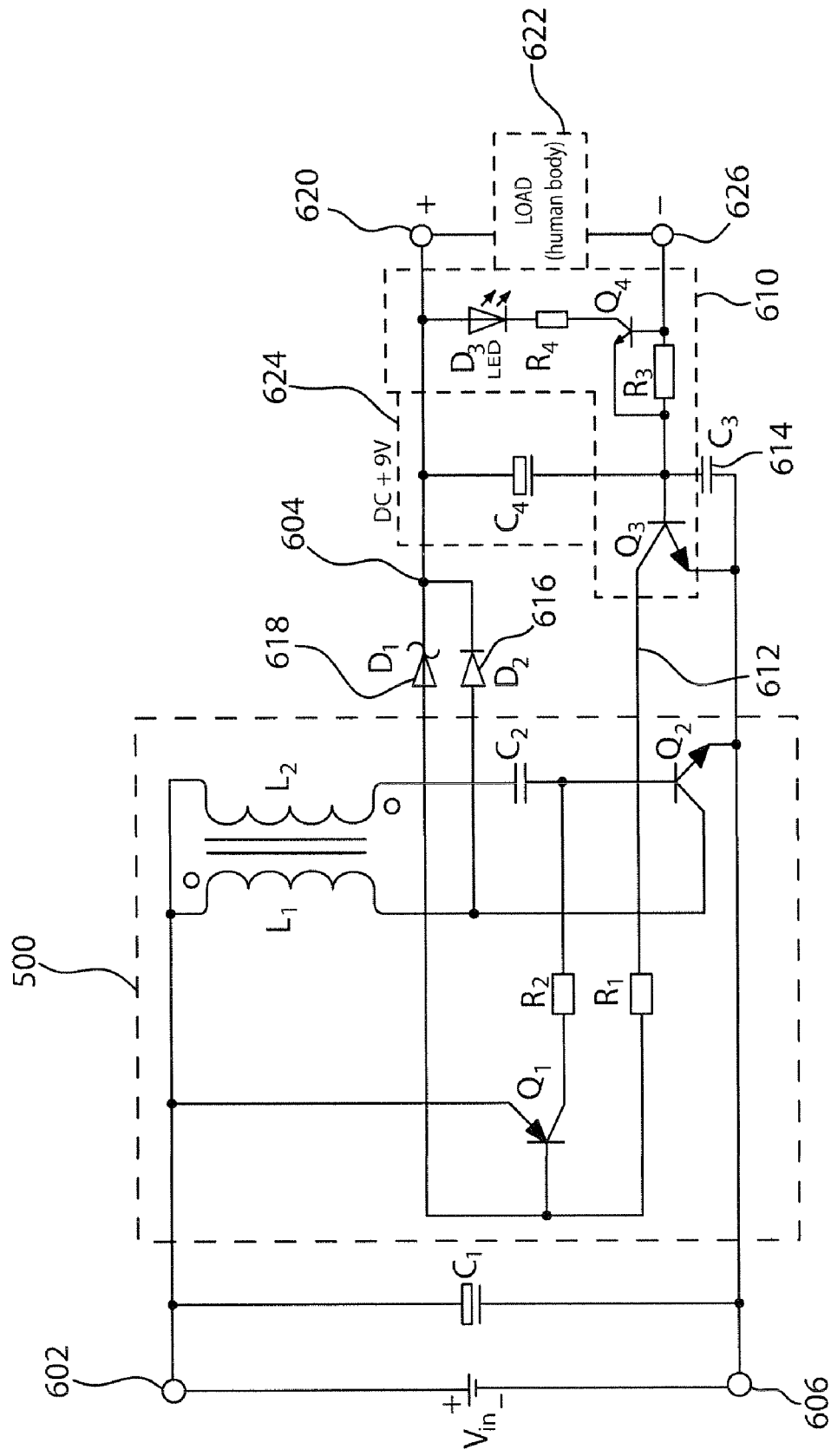
FIG. 6 illustrates detailed circuitry of the block diagram of FIG. 5 having an electronic switch.

Circuitry of the Electronic Switch:

FIG. 6 illustrates an embodiment of the oscillator/booster 500 of the present invention having an electronic switch 610. A connection of load RL 622 can start the operation of the oscillator/booster 500. The connection of RL 622 can cause starting voltage Vstart 612 to switch the oscillator/booster on by, for example, a return to common 606 for a switch inside of the oscillator/booster. Of course, Vstart 612 could also provide a voltage to a switching circuit inside of the oscillator/booster or other technique. In an implementation, RL 622 is a user touching Vout 620 to a Vout return terminal 626, which is connected to electronic switch 610. In this case, current can flow through the resistance of the user's body to activate the electronic switch.

In an implementation, electronic switch 610 includes a transistor Q3 having a base connected through a resistor R3 to Vout return terminal 626. A collector of Q3 is connected to Vstart 612. Optionally, an indicator D3 can be activated when a load RL 622 is coupled between Vout terminal 620 and Vout return terminal 626. Indicator D3 can be a light-emitting diode (LED), sound device, vibration device or any well-known indicator. Indicator D3 can be connected through a resistor R4 to a collector of transistor Q4. An emitter of Q4 is connected to the base of Q3 and a base of Q4 is connected to Vout return terminal 626.

Circuitry of the Oscillator/Booster:

FIG. 6 illustrates an embodiment of an oscillator circuit with a voltage booster according to the present invention. The oscillator/booster circuitry includes a boost inductor L1 that is magnetically coupled to an oscillating inductor L2. That is, inductors L1 and L2 are two closely spaced coils with opposite windings and may be wound on a common core. The common connection point of inductors L1 and L2 is connected to an input voltage 602 (Vin+). The remaining terminal of oscillating inductor L2 is connected in series with an oscillating capacitor C2, which is then connected to the base of transistor Q2. The collector of transistor Q2 is connected to the remaining terminal of L2 and the emitter of transistor Q2 is connected to the input voltage return 606 (Vin−) or common.

A transistor Q1 has an emitter connected to the input voltage 602 and collector connected through a resistive element R2 to the junction of oscillating capacitor C2 and base of transistor Q2 the base of transistor q1 is connected through a resistive element R1 to Vstart 612. A low voltage applied a Vstart 612 will turn transistor Q1 on. In an implementation, transistor Q1 is a PNP-type transistor such as S8550 and transistor Q2 is an NPN-type transistor such as S8050.

When in operation, the oscillating voltage will appear at the junction of the collector of transistor Q2 and the inductor L1. A rectifier 616, such as a diode, can be connected to the oscillating voltage to rectify the oscillating voltage. The rectified voltage can also be regulated by a regulator 618. In an implementation of a regulator, a zener diode is placed between the oscillating voltage at the cathode of the rectifier and the base of transistor Q1. In this way, an overvoltage condition at Vosc 604 can affect transistor Q1 and transistor Q2 to decrease voltage Vosc 618.

The circuit uses separated coils L2, L1 to oscillate and boost up the input voltage. The circuit has the advantage of enabling a change in the oscillating frequency and voltage level by only changing the number turns on coils L2, L1. Changing the output voltage level only requires changing the number of turns of coil L1. The oscillating frequency can be changed by changing the number of turn on coil L2 (or changing the capacitance of capacitor C2). For example, decreasing the number of turns on coil L2 and decreasing the capacitance of capacitor C2 will increase the frequency of oscillation. That is, a desired frequency can be established by adjusting the feedback. In this way, it is easy to adjust the circuit for a desired oscillating frequency and oscillating conditions to provide a desired output voltage and current. The efficiency of the circuit increases as the oscillating frequency increases, but the output current will decrease. The circuit has the advantage of greater stability, higher efficiency and easier oscillation than oscillator/booster circuits using only a single coil.

The oscillator/booster circuit has an advantage of providing a boosted voltage output from a lower DC input voltage.

In an implementation, Twin Tank Circuit (electronic component L1, L2) boost a standard 1.2-1.5VDC disk battery into 9-12V for application to a load. This is advantage, for example, in electrical devices requiring the higher voltage and having a small space because additional disk batteries can be prohibitively large. Moreover, a single battery may be advantageous products that are not disposable. That is, products in which the batteries are replaceable, such as a razor, that is expected to last longer when blades are replaced. In such a case, a user may be reluctant to purchase a product requiring six 1.5 V batteries.

Operation of the Electronic Switch:

In operation, connection of load RL 622, a user touching Vout terminal 626 at the same time as Vout return terminal 626, for example, enables a current to flow from Vin 602 through inductor L1 and rectifier diode 616 the base of Q3 through R3 to turn on transistor Q3. Transistor Q3 on provides a low resistance path for Vstart 612 to common line 606. As discussed herein below, the low resistance path for Vstart to common line 606 can be used to start the oscillator/booster 500.

Connection of RL can also provide current to the base of transistor Q4 to turn on transistor Q4, which, in turn, draws current through, and activates, indicator D3. A capacitor 614 (C3) across the base-emitter junction of Q3 is a high frequency filter.

When the output terminal of the oscillator/boost circuit is not connected to load RL 622, there is no electrical current at the base of Q3 and Q3 is off. Q3 being off keeps transistors Q1 and Q2 off. Accordingly, when RL is not applied the oscillator/booster does not consume any power. As such, a separate mechanical switch to turn on power is not necessary.

Operation of the Oscillator/Booster Circuit:

As discussed herein above, when a load RL 622 is present across terminals 620, 626, electronic switch 610 operates to start the oscillator/booster. That is, transistor Q3 goes from off to on and the collector and emitter of transistor Q3 may be considered as connected. With transistor Q3 on, current will be drawn through resistor R1 and the emitter-base junction of transistor Q1 turning on transistor Q1. When transistor Q1 is on, the collector and emitter of transistor Q1 may be considered as connected and a current will flow through resistor R2 to the base of transistor Q2 turning on transistor Q2. When transistor Q2 is on, the collector and emitter of transistor Q2 can be considered connected and the voltage Vin 602 will be applied across inductor L1. Current will flow through inductor L1 causing storage of energy in the concurrent magnetic field developed in inductor L1. At the same time a current is induced in inductor L2 because inductor L2 is magnetically coupled to inductor L1 (inductors L1 and L2 are two closely spaced coils with opposite windings).

The current induced in inductor L2 will charge capacitor C2 toward Vin 602 and the potential on resistor R1 and resistor R2 will decrease as the current charges capacitor C2. As capacitor C2 charges, transistors Q2 and Q1 will go from an on state back into cutoff and capacitor C2 will discharge.

As transistor Q2 enters cutoff, an inductive back voltage is produced by inductor L1, which is higher than the input voltage Vin 602, due to the decrease in current flow though inductor L1 and the concurrent collapse of the magnetic field and release of stored energy. The inductive back voltage is negative on top and positive on the bottom (of inductor L1 as illustrated) and is in parallel with input voltage Vin 602 and current will flow through rectifier diode D2 to charge output filter capacitor 624 to Vosc 604.

Figure 7:
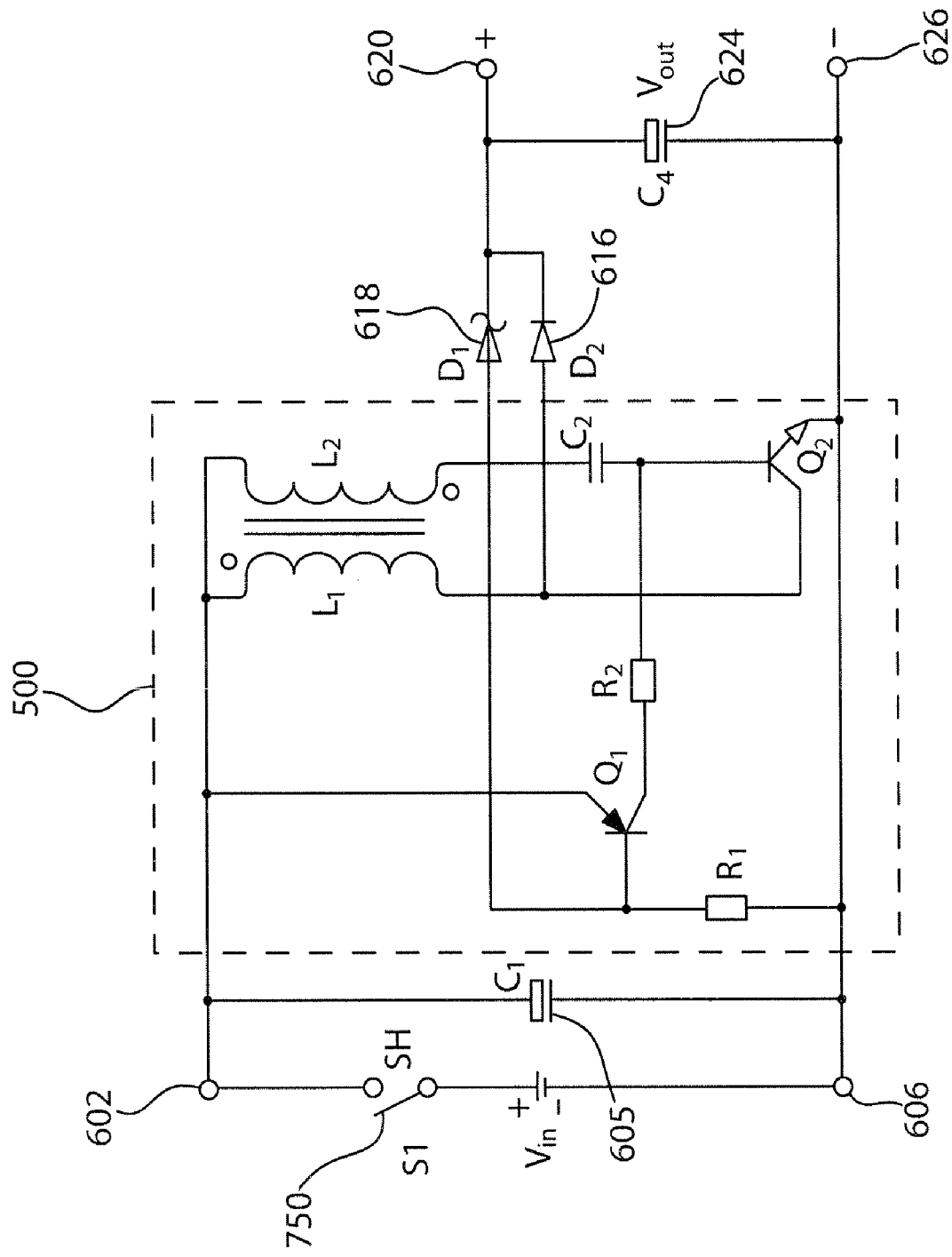
FIG. 7 illustrates detailed circuitry of the block diagram of FIG. 5 having an on/off switch.

The process will repeat as long as transistor Q1 can go into an on state, whether by action of the electronic switch 610 as discussed above or by another technique such as described herein with respect to an alternative implementation. of FIG. 7.

Regulator diode D1 can be used to assure that Vosc 604 does not exceed a specified voltage. In an implementation, regulator diode D1 is a zener diode having the specified breakdown voltage. Should Vosc exceed the specified voltage, regulator diode D1 will breakdown and limit the value of Vosc by providing a current path through resistor R1 and transistor switch Q3 (which is in the on state when the oscillator booster is operating) to Vin common 606. The excess potential on resistor R1 will increase and, when exceeding a threshold, will drive transistor Q1 into cutoff causing transistor Q2 into cutoff as well until the voltage on R1 decreases to permit transistor Q1 to return to the saturated state.

Without rectifier diode D2, the duty cycle of voltage Vosc of the oscillator/booster is 50%, which indicates that transistor Q1 and Q2 are in cutoff half of the time. Regulator diode D1 can make the output of the oscillator/booster Vosc more stable.

Adjusting the impedance values of R1 changes the value of the output current. Of course, transistors Q1 and Q2 may need higher current carrying capacity as well, as is commonly understood by those of ordinary skill. Adjustment of the breakdown voltage of D1 and the inductance values of coils L1 change the value of the output voltage of the oscillator/booster Vosc.

FIG. 7 illustrates an oscillator/booster having a switching device 750 rather than the automatic electronic switch 610 of FIG. 6. The operation of the oscillator/booster of FIG. 7 is substantially the same as in FIG. 6 and only the differences will be described. In this implementation, the base of transistor Q1 is connected through resistive element R1 to common line 606, rather than to an electronic switch. Accordingly, transistor Q1 will go into the on state when switching device 750 connects input voltage Vin to the circuit, regardless of whether a load is applied across terminals 620, 626. Moreover, output voltage Vout return terminal 626 is also connected to input voltage return 606. Switching device 750 can be any appropriate device including a toggle, slide, pressure or bat switch. With transistor Q1 in the on state, the circuit operates substantially the same as described above with respect FIG. 6.

Figure 8:
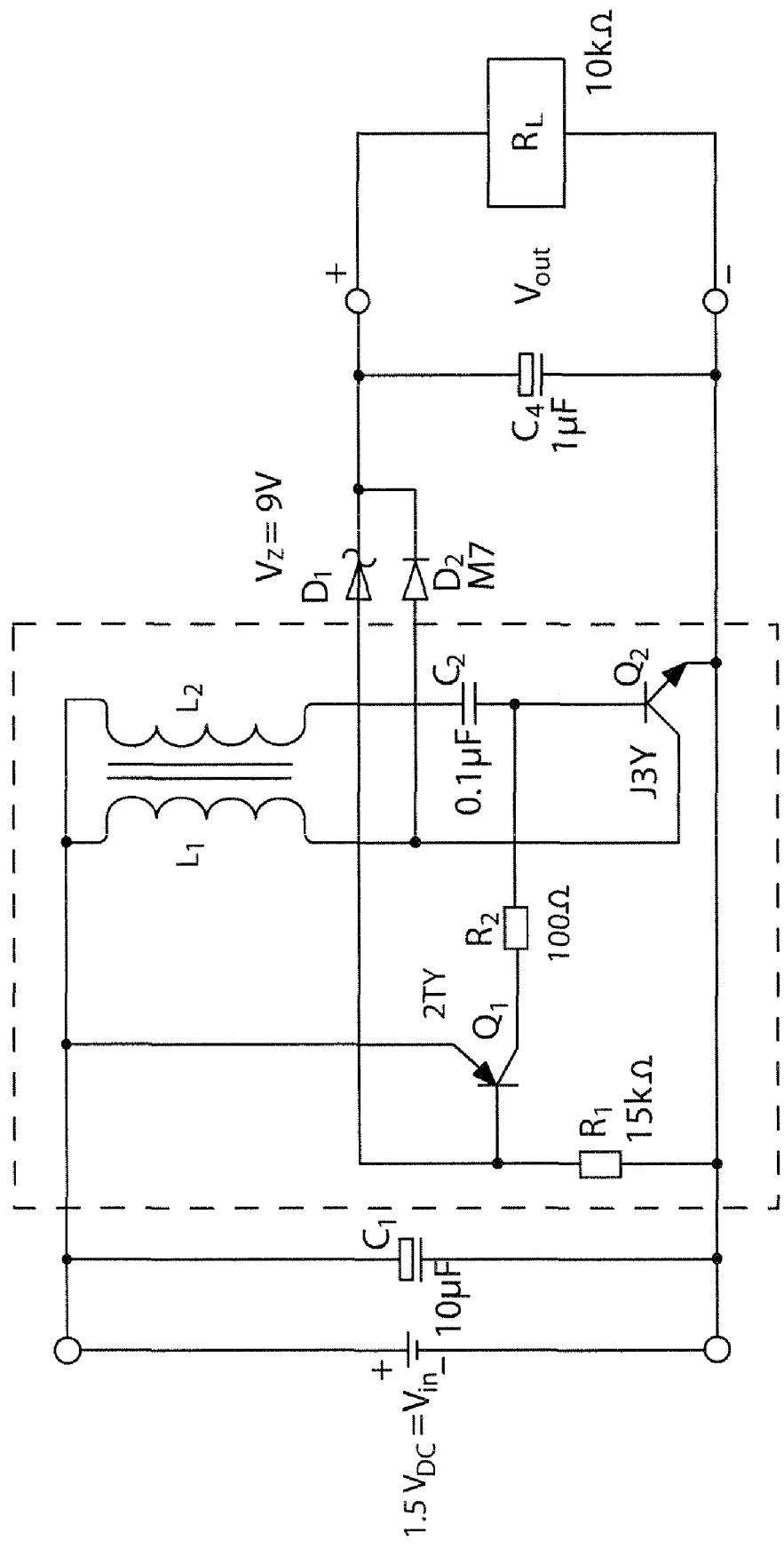
FIG. 8 illustrates a particular embodiment an oscillator circuit with voltage booster.
Figure 9A:
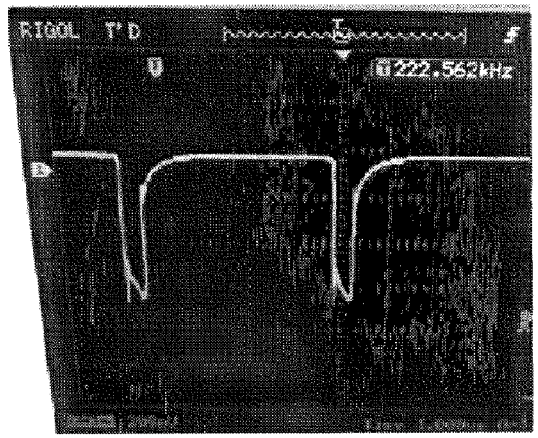
FIGS. 9A-9C are oscilloscope wave forms at particular locations in the embodiment of FIG. 8.
Figure 9B:
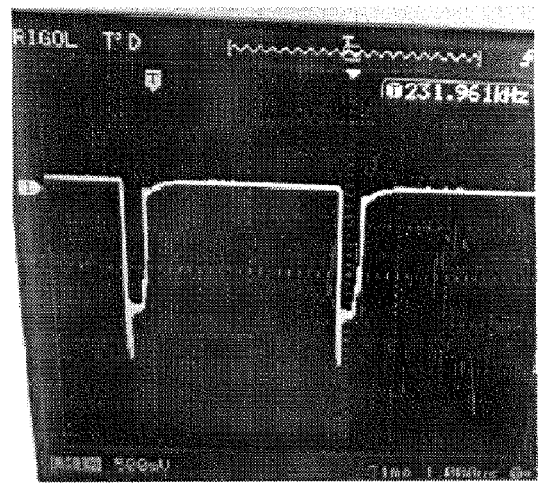
Figure 9C:
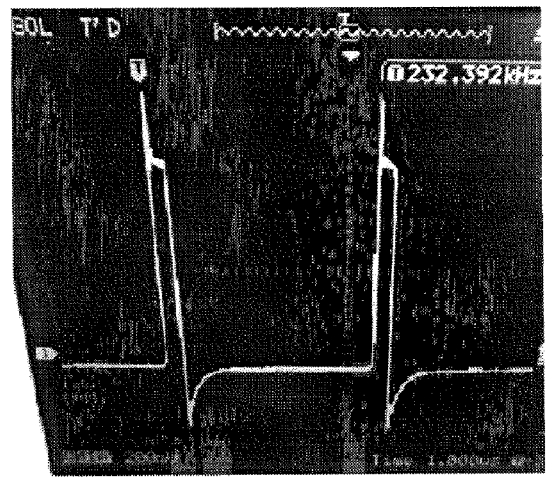

FIG. 8 illustrates a particular embodiment of the oscillator with voltage booster according to the present disclosure. In the illustrated embodiment, inductor L1 has about 10 turns of wire while inductor L2 has about 40 turns of wire. Capacitor C2 has a value of 0.1 microfarad. A simulated load RL is about 10 Kohms. The input voltage Vin is a 1.5 VDC battery. FIG. 9 illustrates the AC waveform at the transistor Q1 base (FIG. 9A), transistor Q2 base (FIG. 9B) and transistor Q2 collector (FIG. 9C). As discussed above, the voltage at transistor Q2 collector is the oscillating boosted voltage, which can be later rectified and regulated to provide a regulated DC output voltage.

Other embodiments are within the scope of the following claims.

What is claimed is:

1. An oscillator circuit with voltage booster, comprising:
 a first inductor;
 a second inductor magnetically coupled to the first inductor, a first terminal of the of the second inductor connected to a first terminal of the first inductor at an input voltage junction point;
 a first transistor having a first transistor emitter connected to the input voltage junction point, a first transistor collector and a first transistor base;

a second transistor having a second transistor emitter connected to the input voltage common return point, a second transistor collector coupled to a second terminal of the first inductor and a second transistor base connected to the first transistor collector;

a capacitor in series with the second inductor, having a capacitor first terminal connected to a second terminal of the second inductor and having a capacitor second terminal connected to the second transistor base;

wherein when a direct current voltage is applied across the input voltage junction point and the input voltage common return point, and a predetermined voltage level is applied to the first transistor base to turn the first transistor ON then an oscillating voltage occurs at the second transistor collector.

2. The oscillator circuit of claim 1, wherein the first inductor and the second inductor are wound in opposite directions.

3. The oscillator circuit of claim 1, wherein the first transistor is a PNP type transistor and second transistor is an NPN type transistor.

4. The oscillator circuit of claim 3, wherein
the first transistor is type S8550,
the second transistor is type S8050.

5. The oscillator circuit of claim 3, wherein a filter is connected between the input voltage junction point and the input voltage common return point.

6. The oscillator circuit of claim 3, comprising:
a rectifier to rectify the oscillating voltage into direct current (DC) voltage; and
a regulator to regulate the direct current (DC) voltage to a desired value.

7. The oscillator circuit of claim 6,
wherein the rectifier is a diode having a rectifier anode connected to the second transistor collector, and
wherein the regulator is a zener diode having a zener cathode connected to a cathode of the rectifier and a zener anode connected to the first transistor base.

8. The oscillator circuit of claim 7, comprising:
an electronic switch to cause the first transistor into the ON state,
wherein the second transistor is in an ON state when the first transistor is in the ON state.

9. The oscillator circuit of claim 8, wherein the electronic switch comprises:
a third transistor having a third transistor collector coupled to the first transistor base and a third transistor emitter connected to the input voltage common return point;
a fourth transistor having a fourth transistor emitter connected to a base of the third transistor, a fourth transistor base coupled to the base of the third transistor; and
a signal device coupled from cathode of the rectifier to a collector of the fourth transistor,
wherein the oscillating voltage is rectified and regulated into an output voltage measured between a positive terminal connected to the cathode of the rectifier and a negative terminal connected to the fourth transistor base, and
wherein when the output voltage is connected to a load, the signal device is activated and the predetermined voltage level is applied to the first transistor base.

10. The oscillator of claim 9, wherein the signal device is a light emitting diode.

11. The oscillator of claim 9, wherein the load is a user touching the positive terminal and the negative terminal of the output voltage.

12. The oscillator of claim 3, wherein the second inductor and the capacitor are selected to cause a desired oscillation frequency of oscillating voltage.

13. The oscillator of claim 12, wherein the desired oscillation frequency is determined according to the formula:

$$\text{frequency} \approx \frac{1}{2\pi\sqrt{LC}}$$

where L is the value of the second inductor and C is the value of the capacitor.

14. The oscillator of claim 7, comprising a switching device to alternatively connect or disconnect the DC voltage to the input voltage junction point,
wherein when the DC voltage is connected to the input voltage junction point, then the oscillating voltage is rectified and regulated into an output voltage measured between a positive terminal connected to the cathode of the rectifier and an input voltage common return point.

15. An oscillator circuit with voltage booster comprising:
an first inductor,
a capacitor connected in series with a first terminal of the first inductor;
a first transistor having a base connected to the series connected capacitor and first inductor;
a second inductor magnetically coupled and wound in an opposite direction to the first inductor and having a first terminal of the second inductor connected to a second terminal of the first inductor at a junction point and a second terminal of the second inductor connected to the collector of the first transistor;
a second transistor having a second transistor collector coupled to the base of the first transistor,
wherein an oscillating voltage is produced at the collector of the first transistor when a direct current voltage is applied to the junction point.

16. An oscillator circuit with voltage booster comprising:
a first inductor;
a second inductor magnetically coupled to the first inductor and wound in the opposite direction and having a terminal in common;
a capacitor in series with second inductor;
a first transistor to control current through the first inductor; and
a second transistor to drive the first transistor to an on state,
wherein when an input voltage is applied to the terminal in common, the capacitor charges through the second inductor and discharges through the first transistor dependent on a state of the second transistor.

* * * * *